(12) United States Patent
Culligan et al.

(10) Patent No.: US 7,037,599 B2
(45) Date of Patent: May 2, 2006

(54) ORGANIC LIGHT EMITTING DIODES FOR PRODUCTION OF POLARIZED LIGHT

(75) Inventors: Sean W. Culligan, Rochester, NY (US); Yanhou Geng, Rochester, NY (US); Shaw H. Chen, Penfield, NY (US); Kevin P. Klubek, Webster, NY (US); Kathleen M. Vaeth, Rochester, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 116 days.

(21) Appl. No.: 10/377,046

(22) Filed: Feb. 28, 2003

(65) Prior Publication Data

US 2004/0170861 A1    Sep. 2, 2004

(51) Int. Cl.
*H05B 33/14* (2006.01)
(52) U.S. Cl. .................. 428/690; 428/917; 257/40; 313/504; 313/506
(58) Field of Classification Search ............... 313/503, 313/504, 506; 428/690, 917; 252/301.16
See application file for complete search history.

(56) References Cited

U.S. PATENT DOCUMENTS

| | | | |
|---|---|---|---|
| 3,172,862 A | 3/1965 | Gurnee et al. | 252/301.3 |
| 3,710,167 A | 1/1973 | Dresner et al. | 313/108 |
| 4,356,429 A | 10/1982 | Tang | 313/504 |
| 4,769,292 A | 9/1988 | Tang et al. | 428/690 |
| 6,040,069 A * | 3/2000 | Lupo et al. | 428/690 |
| 6,489,044 B1 | 12/2002 | Chen et al. | 428/690 |
| 6,699,597 B1 * | 3/2004 | Bellmann et al. | 428/690 |
| 2002/0079831 A1 | 6/2002 | He et al. | 313/504 |
| 2002/0158574 A1 * | 10/2002 | Wolk et al. | 313/504 |
| 2002/0173617 A1 * | 11/2002 | Yasuda et al. | 528/422 |

OTHER PUBLICATIONS

Tang et al, Electroluminescence of doped organic thin films, J. Appl. Phys. 65 (9) May 1, 1989, pp. 3610-3616.
Geng et al, Monodisperse Oligofluorenes Forming Glassy-Nematic Films For Polarized Blue Emission, Chem. Mater. 2003, 15, 542-549.
J. Dresner, Double Injection Electroluminescence in Anthracene, RCA Review, RCA Laboratories, Jun. 1969, pp. 322-334.

* cited by examiner

*Primary Examiner*—Rena Dye
*Assistant Examiner*—Camie S. Thompson
(74) *Attorney, Agent, or Firm*—Raymond L. Owens

(57) ABSTRACT

An OLED device comprising a substrate, an anode electrode and a cathode electrode, a uniaxial alignment layer disposed between the anode electrode and the cathode electrode, a light-emitting layer disposed over the uniaxial alignment layer and capable of producing polarized light, and a carrier confinement layer disposed over the light emitting layer and wherein the carrier confinement layer blocks either holes, electrons, or excitons. The light-emitting layer includes an oligomeric fluorene or a mixture of oligomeric fluorenes.

19 Claims, 1 Drawing Sheet

ORGANIC LIGHT EMITTING DIODES FOR PRODUCTION OF POLARIZED LIGHT

FIELD OF INVENTION

This invention relates to organic light emitting diode (OLED) devices. More specifically, this invention relates to organic light emitting diode devices capable of producing efficient polarized light.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322–334, 1969; and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often >100V.

More recent organic EL devices include an organic EL element consisting of extremely thin layers (e.g. <1.0 µm) between the anode and the cathode. Herein, the term "organic EL element" encompasses the layers between the anode and cathode electrodes. Reducing the thickness lowered the resistance of the organic layer and has enabled devices that operate at much lower voltages. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al [*J. Applied Physics*, Vol. 65, Pages 3610–3616, 1989]. The light-emitting layer commonly consists of a host material doped with a guest material. Still further, there has been proposed in U.S. Pat. No. 4,769,292 a four-layer EL element comprising a hole-injecting layer (HIL), a hole-transporting layer (HTL), a light-emitting layer (LEL) and an electron transport/injection layer (ETL). These structures have resulted in improved device efficiency.

There have also been proposed EL devices capable of producing polarized electroluminescence for applications as backlights in liquid crystal displays, as disclosed in U.S. Pat. Nos. 6,040,069A1 and 6,489,044B1, and U.S. Patent Application Publications 20020158574A 1 and 20020079831 A1. Specifically, a class of thermotropic nematic polymers known as poly(fluorene)s have been actively pursued for the production of polarized electroluminescence because the constituting fluorene unit possesses high luminescene yield and its rod-like structure favors uniaxial alignment required for polarized light emission. The uniaxial alignment of the conjugated backbone is usually achieved by thermally annealing a poly(fluorene) film deposited on an alignment layer at a sufficiently high temperature and for a sufficiently long duration of time. The alignment layer is generally a polymer film such as polyimide. For OLED applications, an electrically conductive alignment layer such as poly(3,4-diethylene-dioxythiophene): polystyrene sulfonic acid, PEDOT/PSS, has been used successfully. These alignment films are necessarily rubbed in a specific direction to produce the desired alignment properties. Depending on the molecular weight of the polymer, substantial alignment of the conjugated backbone chromophore will require an annealing temperature as high as 200° C. and above, and an annealing time as long as several hours. Although polarized light emission has been demonstrated in these polymeric devices, there is a need to further improve the light generation efficiency in order to expand the general utility, particularly in display applications where high brightness is almost always preferable.

To overcame some of these disadvantages of polymeric materials, oligomeric analogs with a characteristic shorter chain length have been considered for polarized light emission as described by Geng et al in Chem. Mater. 15, 542 (2003).

SUMMARY OF THE INVENTION

It is an object of this invention to produce an OLED device capable of efficiently generating polarized light.

This object is achieved in an OLED device comprising a substrate, an anode electrode and a cathode electrode, a uniaxial alignment layer disposed between the anode electrode and the cathode electrode, a light-emitting layer disposed over the uniaxial alignment layer and capable of producing polarized light, and a carrier confinement layer disposed over the light emitting layer and wherein the carrier confinement layer blocks either holes, electrons, or excitons.

A preferred class of materials useful in the light-emitting layer includes a fluorene or mixture of oligomeric fluorenes of molecular formula:

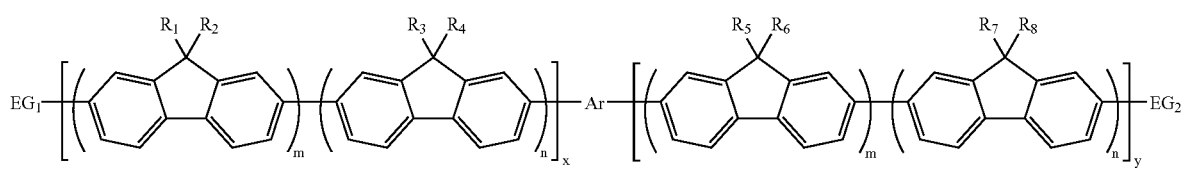

wherein:

$R_1, R_2, R_3, R_4, R_5, R_6, R_7, R_8$ are each individually alkyl of from 1 to 20 carbon atoms, which are branched or unbranched, aryl or substituted aryl of from 5 to 24 carbon atoms, heteroaryl or substituted heteroaryl of from 5 to 24 carbon atoms, alkoxy, aryloxy, alkyl ether or aryl ether;

m+n is in the range of 1 to 20;

x+y is in the range of 1 to 20;

$EG_1$ and $EG_2$ are hydrogen, alkyl of from 1 to 20 carbon atoms, which are branched or unbranched, phenyl or substituted phenyl;

and Ar is:

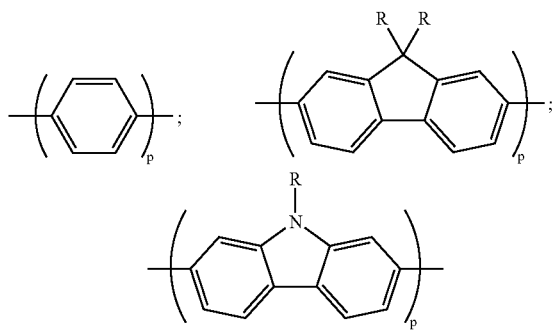

wherein:

p is in a range of from 1 to 10;

R is alkyl of from 1 to 20 carbon atoms, which are branched or unbranched, aryl or substituted aryl of from 5 to 24 carbon atoms, heteroaryl or substituted heteroaryl of from 5 to 24 carbon atoms, alkoxy, aryloxy, alkyl ether or aryl ether, or,

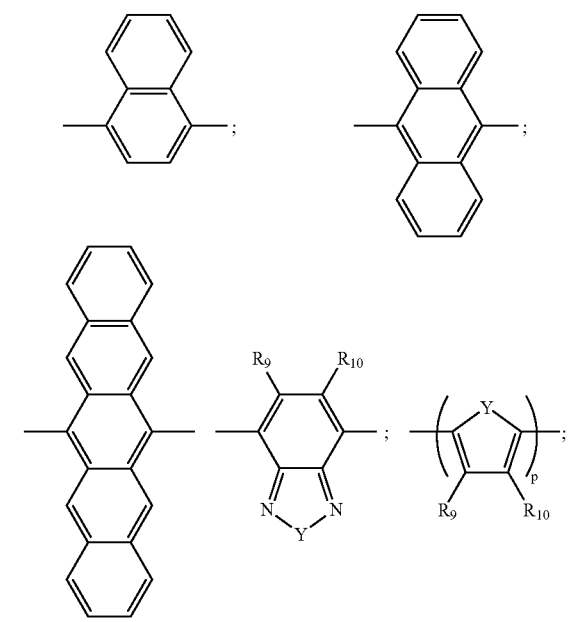

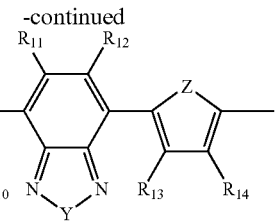

wherein:

p is in the range of from 1 to 10;

$R_9, R_{10}, R_{11}, R_{12}, R_{13}$, and $R_{14}$ are each individually hydrogen, alkyl of from 1 to 20 carbon atoms, which are branched or unbranched, aryl or substituted aryl of from 5 to 24 carbon atoms, heteroaryl or substituted heteroaryl of from 5 to 24 carbon atoms, alkoxy, aryloxy, alkyl ether or aryl ether;

and X, Y, and Z are individually oxygen, sulfur, or nitrogen, or,

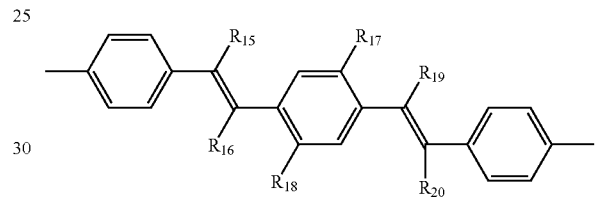

wherein:

$R_{15}, R_{16}, R_{19}$, and $R_{20}$ are each individually hydrogen or cyano;

$R_{17}, R_{18}$, are hydrogen, cyano, alkoxy, alkyl of from 1 to 20 carbon atoms, aryl or substituted aryl of from 5 to 24 carbon atoms.

An advantage of the invention is that the OLED device is highly efficient in generating polarized light with a high polarization ratio.

Another advantage of the invention is that solution processing can be used in the fabrication of the light-emitting layer.

Another advantage of the invention is that low temperature processing can be used in the fabrication of the light-emitting layer.

Another advantage of the invention is that OLED devices can be made to efficiently generate light of various colors with a high polarization ratio.

DETAILED DESCRIPTION OF THE INVENTION

General Device Architecture

Figure 1:
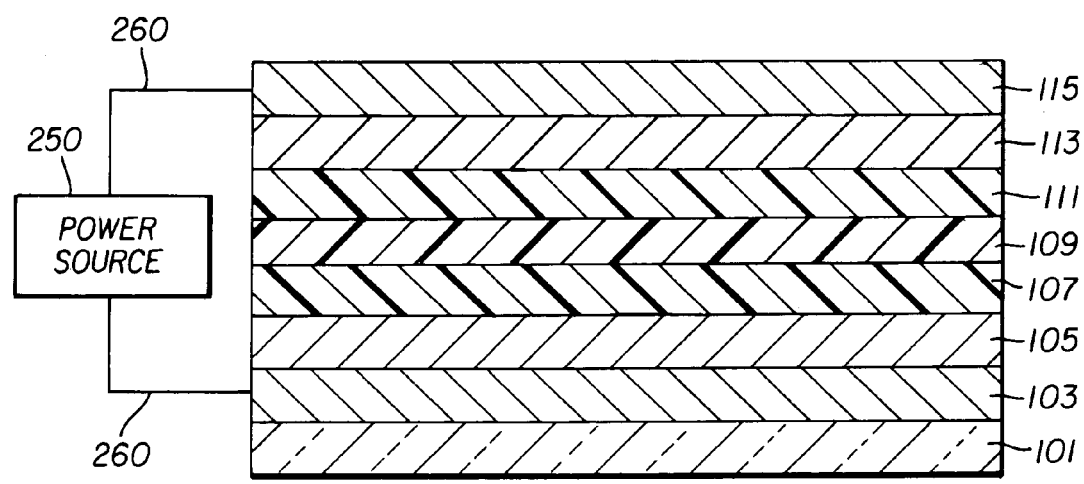
FIG. 1 shows a cross-section of an OLED device which practices the present invention.

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. A typical structure is shown in FIG. 1 and includes a substrate 101, an anode 103, a conductive alignment layer 105, a hole-injection layer 107, a light-emitting layer 109, a carrier-confinement layer 111, an electron-injection layer 113 and a cathode 115. These layers are described in detail below. In the simplest structures, the hole-injection layer 107 and the electron-injection layer 113 are not necessary for the operation of the OLED device as they serve only the function of balancing the holes and electrons injection into the light-emitting layer 109 in order to improve the light-generating efficiency. Note that the substrate 101 may alternatively be located adjacent to the cathode 115, or the substrate 101 may actually constitute the anode 103 or cathode 115. The organic layers between the anode 103 and cathode 115 are conveniently referred to as the organic EL element. The total combined thickness of the organic layers is preferably less than 500 nm.

The anode 103 and cathode 115 of the OLED are connected to a voltage/current source 250 through electrical conductors 260. The OLED is operated by applying a potential between the anode 103 and cathode 115 such that the anode 103 is at a more positive potential than the cathode 115. Holes are injected into the organic EL element from the anode 103 and electrons are injected into the organic EL element at the cathode 115. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate 101 where either the cathode 115 or anode 103 can be in contact with the substrate 101. The electrode in contact with the substrate 101 is conveniently referred to as the bottom electrode. Conventionally, the bottom electrode is the anode, but this invention is not limited to that configuration. The substrate 101 can either be light transmissive or opaque, depending on the intended direction of light emission. The light transmissive property is desirable for viewing the EL emission through the substrate 101. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, electrically passivated metal foils, and circuit board materials. Of course, it is necessary to provide in these device configurations a light-transparent top electrode.

Anode

When EL emission is viewed through anode 103, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Conductive Alignment Layer

The conductive alignment layer 105 is disposed between the electrode on the substrate 101, and the light-emitting layer 109. It serves a dual function: 1) to provide a surface for aligning the molecules in the adjacent light-emitting layer 109 in a uniaxial direction; and 2) to provide a conductive path for electrical charges to pass freely between the electrode and the light-emitting layer 109. In an OLED structure where the electrode on the substrate 101 is the anode 103, the conductive alignment layer 105 can be a hole-conductor or a conductor capable of conducting both holes and electrons. Similarly, in an OLED structure where the electrode on the substrate 101 is the cathode 115, the conductive alignment layer 105 can be an electron-conductor or a conductor capable of conducting both holes and electrons.

Various approaches have been attempted in the preparation of the conductive alignment layer 105. One approach is to perform uniaxial rubbing on a solution processed polyimide film, which is commonly used in aligning liquid crystal displays. Since the polyimide film is generally insulating, a useful method to increase the conductivity is to incorporate hole-conducting molecules in the film. Another useful polymeric material is poly(p-phenylenevinylene) which, unlike polyimide, is sufficiently hole-transporting to be used as the conductive alignment layer 105. A conducting polymer, poly(3,4-diethylene-dioxythiophene) and polystyrene sulfonic acid, PEDOT:PSS, has been found to be particularly useful as the conductive alignment layer. Pure poly(thiophenes) also work but the solubility's of the different layers need to be appropriately chosen. In all cases, uniaxial rubbing is required to produce the alignment functionality. An alternative to uniaxial rubbing is noncontact photoalignment which utilizes a photochemical reaction to produce the desired alignment functionality.

Hole-Injecting Layer (HIL)

While not always necessary, it is useful to provide a hole-injecting layer 107 between conductive alignment layer 105 and the light-emitting layer 109. This hole-injecting layer 107 can improve the efficiency of hole injection into the light emitting layer 109 as well as the adhesion of subsequent organic layers on the substrate 101. Suitable materials for use in the hole-injecting layer 107 include, but are not limited to, porphyrinic compounds as described in U.S. Pat. No. 4,720,432, and plasma-deposited fluorocarbon polymers as described in U.S. Pat. No. 6,208,075.

Light-Emitting Layer (LEL)

As more fully described in U.S. Pat. Nos. 4,769,292 and 5,935,721, the conventional light-emitting layer (LEL) 109 of the organic EL element includes a luminescent or fluorescent material where electroluminescence is produced as a result of electron-hole pair recombination in this region. The electroluminescence is generally non-polarized because the molecules commonly used as the luminescent material, unless specifically designed, are incapable of being aligned in any particular orientation with respect to the surface of the substrate 101. The conventional light-emitting layer 109 can include a single material, but more commonly consists of a host material doped with a guest compound or compounds where light emission comes primarily from the dopant and can be of any color. The host materials in the light-emitting layer 109 can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) are useful as the light-emitting layer as described in U.S. Pat. No. 6,169,163 and in *Adv. Mater.* 10 (16) 1998 p. 1340 by H. Spreitzer et al. With these polymeric materials, small molecule dopants can be molecularly dispersed into the polymeric host matrix to form the light-emitting layer 109, or the dopant could be added by copolymerizing a minor constituent in the host polymer as a side pendent or in the main chain to form the light-emitting layer 109.

For polarized light generation, the molecules in the light-emitting layer 109 must be aligned uniaxially along a specific direction, i.e. the rubbed direction of the conductive alignment layer 105. The higher the degree of molecular alignment in the light-emitting layer 109, the greater will be the dichroic emission ratio, which is defined as the ratio of the intensities of the horizontally polarized (along the rubbed axis) light and vertically polarized light. A preferred class of materials useful in the light-emitting layer includes a fluorene or mixture of oligomeric fluorenes of molecular formula:

wherein:

$R_1, R_2, R_3, R_4, R_5, R_6, R_7, R_8$ are each individually alkyl of from 1 to 20 atoms, which are branched or unbranched, aryl or substituted aryl of from 5 to 24 carbon atoms, heteroaryl or substituted heteroaryl of from 5 to 24 carbon atoms, alkoxy, aryloxy, alkyl ether or aryl ether;

m+n is in the range of 1 to 20;

x+y is in the range of 1 to 20;

$EG_1$ and $EG_2$ are hydrogen, alkyl of from 1 to 20 carbon atoms, which are branched or unbranched, phenyl or substituted phenyl;

and Ar is:

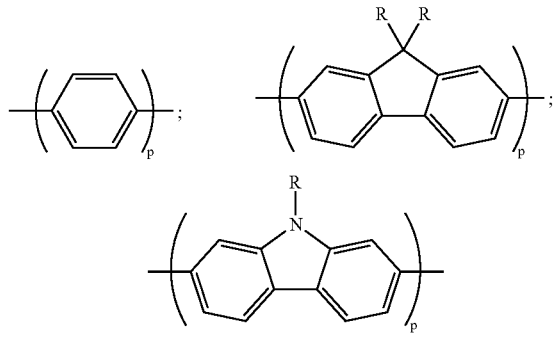

wherein:

p is in a range of from 1 to 10;

R is alkyl of from 1 to 20 carbon atoms, which are branched or unbranched, aryl or substituted aryl of from 5 to 24 carbon atoms, heteroaryl or substituted heteroaryl of from 5 to 24 carbon atoms, alkoxy, aryloxy, alkyl ether or aryl ether, or,

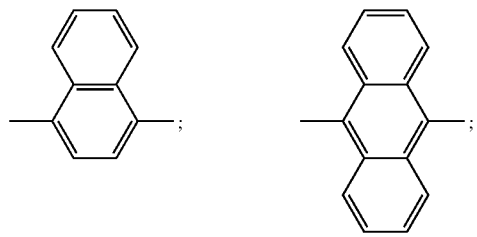

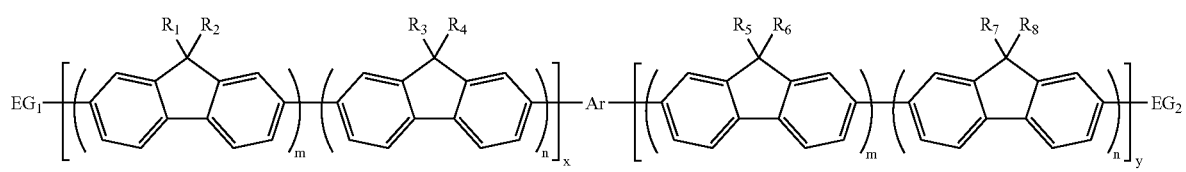

-continued

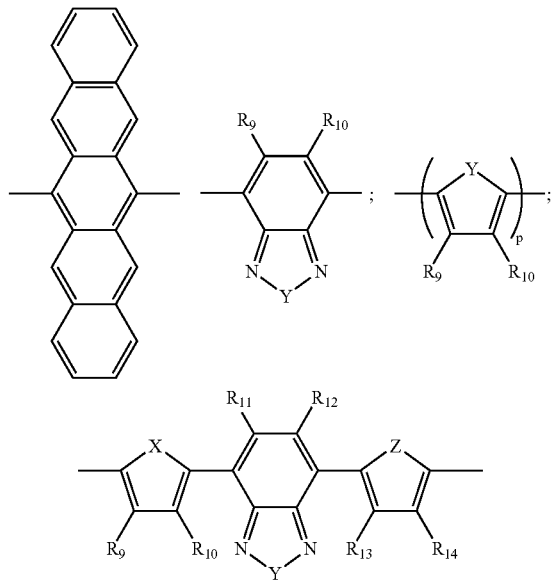

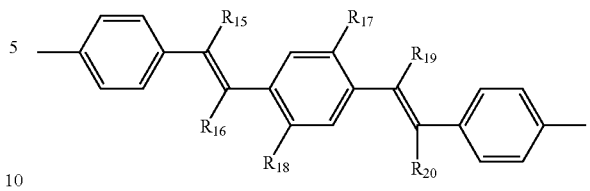

wherein:
R$_{15}$, R$_{16}$, R$_{19}$, and R$_{20}$ are each individually hydrogen or cyano;
R$_{17}$, R$_{18}$, are hydrogen, cyano, alkoxy, alkyl of from 1 to 20 carbon atoms, aryl or substituted aryl of from 5 to 24 carbon atoms.

These materials have several unique characteristics that favor uniaxial alignment and efficient generation of polarized light. They are highly luminescent in solutions as well as in solid films with a photoluminescence yield as high as unity. The fluorene molecules have a structure resembling a rigid rod, thus they possess nematic liquid-crystal-like properties and the propensity to form glassy nematic films suitable for OLED devices. Unlike polymeric materials, such as polyfluorenes, the oligomeric fluorenes have a well-defined length which can be controlled by molecular design and synthesis and high-purity oligomers with excellent solubility can be readily obtained. Through the design of the chain length and the pendent alkyl groups, relatively stable glassy nematic thin film of oligomeric fluorenes with a relatively high glass transition temperature can be obtained. Representative examples of oligomeric fluorenes of molecular structure I are listed as follows:

wherein:
p is in the range of from 1 to 10;
R$_9$, R$_{10}$, R$_{11}$, R$_{12}$, R$_{13}$, and R$_{14}$ are each individually hydrogen, alkyl of from 1 to 20 carbon atoms, which are branched or unbranched, aryl or substituted aryl of from 5 to 24 carbon atoms, heteroaryl or substituted heteroaryl of from 5 to 24 carbon atoms, alkoxy, aryloxy, alkyl ether or aryl ether;
and X, Y, and Z are individually oxygen, sulfur, or nitrogen,

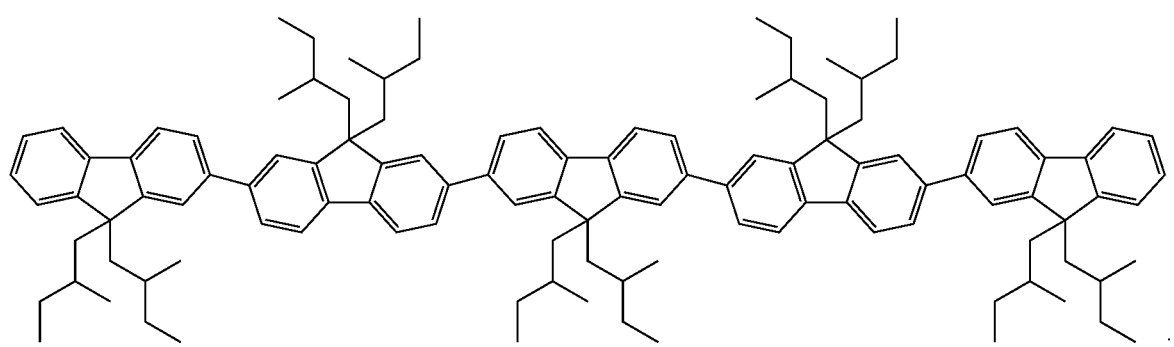

F(MB)5

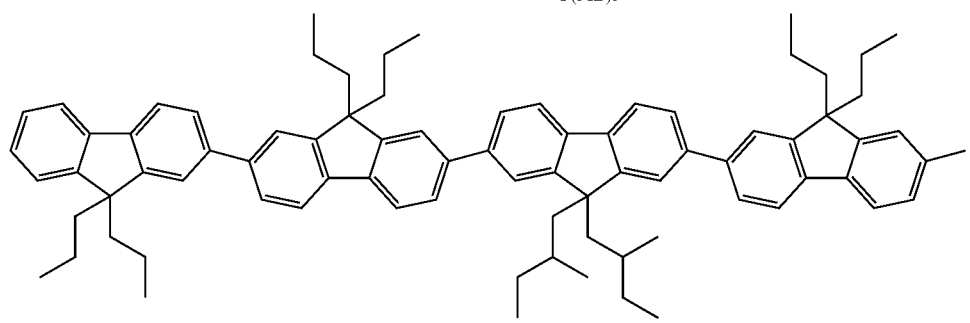

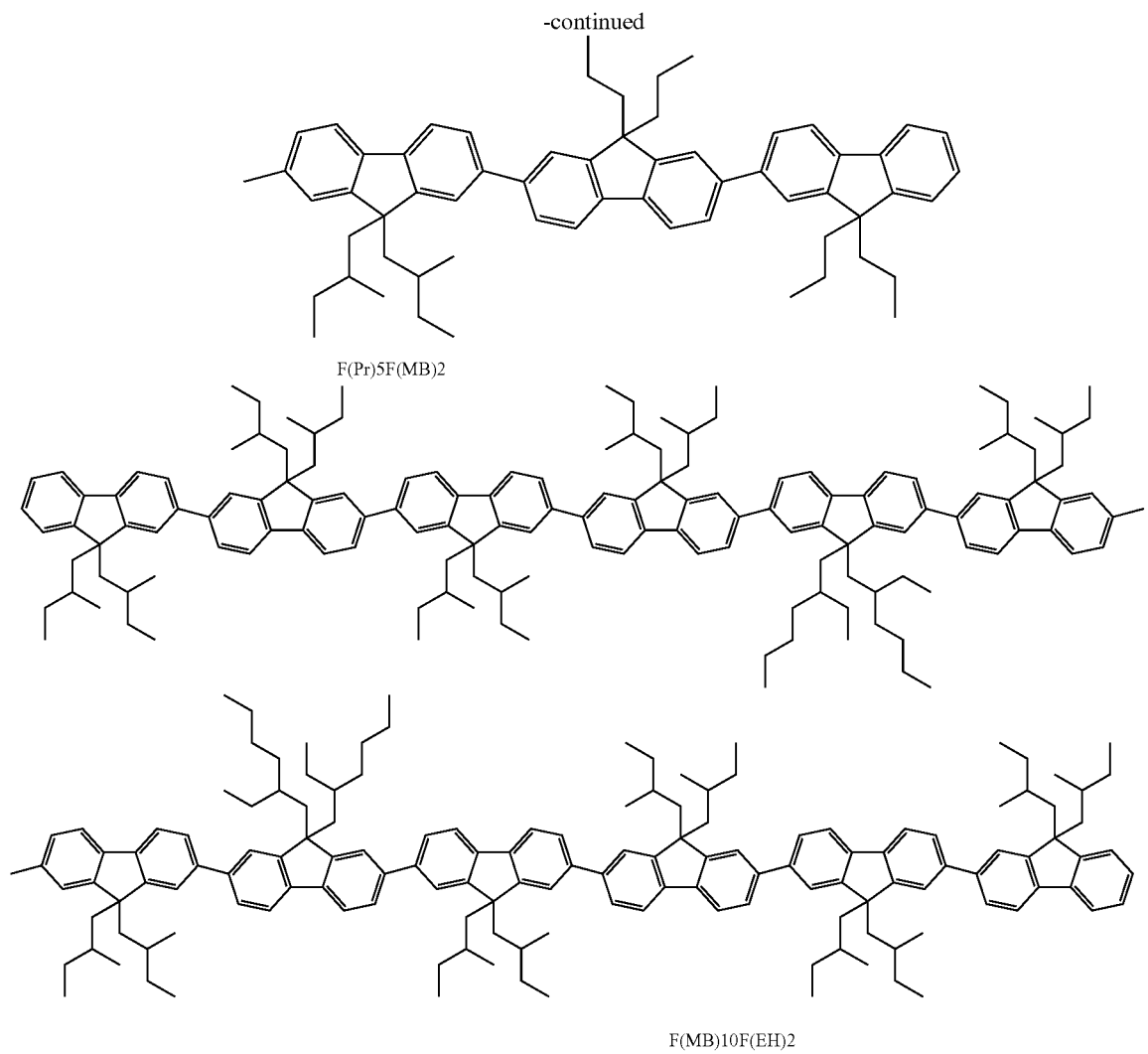

F(Pr)5F(MB)2

F(MB)10F(EH)2

Carrier Confinement Layer (CCL)

In order to generate electroluminescence from the light-emitting layer 109 containing oligomeric fluorenes, it is necessary to transport into the carrier confinement layer 111 holes from the anode 103 and electrons from the cathode 115 and confine their recombination within this layer. This is made possible by disposing a carrier confinement layer 111 adjacent to the light-emitting layer 109. In FIG. 1, the carrier-confinement layer 111 is disposed between the light-emitting layer 109 and the cathode 115. This configuration permits conduction of electrons but not holes. Thus electrons can be transported from the cathode 115 to the light emitting layer 109, and holes transmitted through the light-emitting layer 109 are blocked, confining the holes in the light-emitting layer 109 and consequently, recombination of these electrons and holes within that layer. Because this particular carrier confinement layer 111 is capable of blocking holes and transporting electrons, it is also termed as the hole blocking layer. Organic compounds that are useful in the hole-blocking layer include chelates of oxine (also commonly referred to as 8 quinolinol or 8 hydroxyquinoline).

Other materials include various butadiene derivatives as disclosed in U.S. Pat. No. 4,356,429 and various heterocyclic optical brighteners as described in U.S. Pat. No. 4,539,507. A particularly useful class of materials is the benzazoles as disclosed in U.S. Pat. No. 5,645,948 having a general formula:

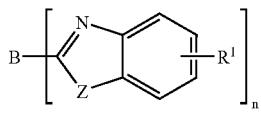

wherein:
n is an integer of from 3 to 8;
Z is O, NR or S; and
R and R are individually hydrogen; alkyl of from 1 to 24 carbon atoms, for example, propyl, t-butyl, heptyl, and the like; aryl or hetero-atom substituted aryl of from 5 to 20 carbon atoms for example, phenyl and naphthyl, furyl, thienyl, pyridyl, quinolinyl and other heterocyclic systems; or halo such as chloro, fluoro; or atoms necessary to complete a fused aromatic ring;

B is a linkage unit consisting of alkyl, aryl substituted alkyl, or substituted aryl which conjugately or unconjugately connects the multiple benzazoles together.

The triazines as disclosed in U.S. Pat. No. 6,225,467 are also useful as the hole-blocking layer.

A parameter useful in determining the suitability of organic compounds as the hole-blocking layer is ionization potential. This parameter measures the energy required to remove an electron from the highest occupied molecular orbital of the molecule in the hole-blocking layer and can be readily determined by conventional spectroscopic technique known as ultra-violet photoemission spectroscopy (UPS). Compounds possessing a high ionization potential value are particularly useful. Preferred ionization potential values are 5.5 electron-volt or higher.

Whereas the carrier confinement layer 111 as depicted in FIG. 1 represents a single layer deposed between the light-emitting layer 109 and the cathode 115, a secondary layer can be disposed between the carrier confinement layer 111 and the cathode 115. This secondary layer is necessarily an electron-transporting layer and its function is to further improve the injection of electrons from the cathode 115 into the carrier confinement layer 111 and subsequently into the light-emitting layer 109. Useful materials include chelates of oxine (also commonly referred to as 8 quinolinol or 8 hydroxyquinoline); various butadiene derivatives as disclosed in U.S. Pat. No. 4,356,429; and various heterocyclic optical brighteners as described in U.S. Pat. No. 4,539,507; benzazoles as disclosed in U.S. Pat. No. 5,645,948; and the triazines as disclosed in U.S. Pat. No. 6,225,467.

FIG. 1 illustrates that the anode 103 is adjacent to the substrate 101 upon which all other layers of the OLED device are deposited. It is anticipated that the cathode 115 of the OLED can also be adjacent to the substrate 101 upon which all other layers of the OLED device are subsequently deposited. Thus, in this configuration, the layer sequence order is substrate, cathode, uniaxial alignment layer, light-emitting layer, carrier confinement layer, and anode. The carrier confinement layer 111 provides the hole-conducting and electron-blocking function. It is termed as the electron-blocking layer. Useful materials as the electron-blocking layer include aromatic tertiary amines, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Examples of triarylamines are illustrated in U.S. Pat. Nos. 3,180,730; 3,567,450 and 3,658,520. A more preferred class of aromatic tertiary amines are those which include at least two aromatic tertiary amine moieties as described in U.S. Pat. Nos. 4,720,432 and 5,061,569.

The carrier confinement layer 111 may also be used to block the migration or diffusion of excitons generated in the light emitting layer 109 as a result of the recombination of the electron-hole pairs. The necessary and sufficient condition for the carrier confinement layer 111 to be effective as an exciton blocking layer is that the material or materials constituting the carrier confinement layer 111 have an exciton energy greater than that of the light emitting layer 109.

Cathode

When light emission is viewed solely through the anode 103, the cathode 113 used in this invention can include nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material includes a Mg:Ag alloy wherein the percentage of silver is in the range of 1 to 20%, as described in U.S. Pat. No. 4,885,221. Another useful formulation of the cathode 115 includes a bilayer structure comprising a thin layer of LiF followed by a layer of Al as described in U.S. Pat. No. 5,677,572. Other useful cathode material sets include, but are not limited to, those disclosed in U.S. Pat. Nos. 5,059,861; 5,059,862, and 6,140,763.

Although it is not necessary, an electron-injection layer 113 may be used to improve the electron injection efficiency from the cathode 115. A useful formulation is an organic layer doped with a strong electron donor such as an alkaline or alkaline earth metal as disclosed in EP 1011155. When light emission is viewed through the cathode 115, the cathode 115 must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,393, EP 1 076 368 and JP 3,234,963. Cathode materials are typically deposited by evaporation, sputtering, or chemical vapor deposition. When needed, patterning can be achieved through many well known methods including, but not limited to, through-mask deposition, integral shadow masking, for example, as described in U.S. Pat. No. 5,276,380 and EP 0 732 868, laser ablation, and selective chemical vapor deposition.

Deposition of Organic Layers

The organic materials mentioned above are suitably deposited using various methods including vapor-phase deposition such as sublimation and deposition from a fluid. Vapor-phase deposition includes deposition at high vacuum below $10^{-5}$ torr or under reduced pressure above $10^{-4}$ torr in the presence of a carrier gas, typically inert gas such as nitrogen or argon. Another vapor-phase deposition method such as thermal transfer from a preformed donor sheet disclosed in U.S. Pat. No. 5,756,240 may also be used for defining patterned layers. Methods for deposition from a fluid include conventional spin-casting, knife-edge coating and spray coating. Inkjet coating may also be used in forming patterned layers.

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and dessication include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing the layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and antiglare or anti-reflection coatings may be specifically provided over the cover or as part of the cover.

EXAMPLES

Example 1

Preparation of OLED

An indium tin oxide (ITO) coated glass substrate was first cleaned using a commercial glass plate cleaner. The steps included scrubbing using a rotating brush with a detergent solution, rinsing in deionized water, and drying in infrared light. The cleaned substrate was then treated in an oxygen plasma for 2–4 minutes prior to device fabrication.

A layer of rubbed poly(3,4-ethylenedioxythiophene)/poly(styrene sulfonate) (PEDOT/PSS) film was deposited on the ITO substrate. The procedure was as follows: The ITO substrate was first flooded with a filtered solution of electronic grade (PEDOT/PSS) provided by Bayer and allowed to rest for 1 minute, followed by spinning for 2 minutes at 2500 RPM. The thin PEDOT/PSS film was dried under flowing argon for 30 minutes at a temperature of 120° C. The film was then uniaxially rubbed using a buffing tool consisting of a velvet cloth on a rotating drum. The drum rotated at approximately 750 RPM and the film was passed under the rotating cloth 3 times. A micrometer allowed the height of the wheel, and hence the rubbing force, to be controlled.

A layer of light-emitting layer of monodomain nematic oligomeric fluorene was fabricated on top of the rubbed PEDOT/PSS layer. The procedure was as follows: A filtered 0.8 weight percent solution of a nematic oligomeric fluorene in chloroform was deposited on the substrate and spun for 2 minutes at 4000 RPM, resulting in a layer thickness of about 70 nm. The film was then kept at room temperature under vacuum for 3–5 hours to remove residual solvent. Thermal annealing to produce a fluorene film uniaxially aligned along the rubbed direction of PEDOT/PSS layer was then performed in an argon atmosphere at a temperature of 130° C. for 60 minutes. The temperature was selected to be about 5 to 10 degrees above the glass transition temperature of the fluorene film.

The OLED device was completed by the deposition of the cathode layer on top of the light emitting layer. The procedure was as follows: After the thermal annealing step, the substrate with the PEDOT:PSS/oligomeric fluorine layers was transferred to a vacuum chamber of $10^{-6}$ torr. A cathode consisting of either Ca/Ag or Mg/Ag or LiF/Al was deposited on top of oligomeric fluorene layer. The OLED device was encapsulated in a dry nitrogen glove box for protection against moisture and oxygen.

Example 2

An OLED device was prepared as described in Example 1. The nematic oligomeric fluorene used in the light-emitting layer is dodecafluorene F(MB)10F(EH)2. The layer thickness is 70 nm. The cathode is a bilayer of Ca (150 nm) and Ag (50 nm). The electroluminescence characteristics obtained at 20 mA/cm² are as follows: luminance efficiency is 0.08 cd/A and the CIEx and CIEy color coordinates are 0.188 and 0.169, respectively.

Example 3

An OLED device was prepared as described in Example 1. The nematic oligomeric fluorene used in the light-emitting layer is dodecafluorene F(MB)10F(EH)2. The layer thickness is 70 nm. A 30 nm electron-transporting layer of 1,3,5-tri(phenyl-2-benzimidazolyl)benzene (TPBI) was deposited on top of the light-emitting layer at a rate of 0.4 nm/s. A cathode layer consisted of co-evaporated Mg and Ag, was deposited at rates of 1 and 0.05 nm/s, respectively, on the electron-transporting layer. The electroluminescence characteristics obtained at 20 mA/cm² are as follows: luminance efficiency is 1.10 ed/A and the CIEx and CIEy color coordinates are 0.159 and 0.079, respectively. The drive voltage of the device is 9.5 volts. The horizontal to perpendicular polarization ratio for the totally integrated emission from 400 nm to 600 nm is 14.4. The polarization ratio obtained at 424 nm is 17.3.

Example 4

An OLED device was prepared as described in Example 3. The nematic oligomeric fluorene used in the light-emitting layer is dodecafluorene F(MB)10F(EH)2. The layer thickness is 35 nm. The electroluminescence characteristics obtained at 20 mA/cm² are as follows: luminance efficiency is 1.07 cd/A and the CIEx and CIEy color coordinates are 0.156 and 0.070, respectively. The drive voltage of the device is 6.2 volts. The horizontal to perpendicular polarization ratio for the totally integrated emission from 400 nm to 600 nm is 24.6. The polarization ration obtained at 424 nm is 27.1.

Example 5

An OLED device was prepared as described in Example 3. The nematic oligomeric fluorene used in the light-emitting layer is heptafluorene F(Pr)5F(MB)2. The layer thickness is 70 nm. The electroluminescence characteristics obtained at 20 mA/cm² are as follows: luminance efficiency is 0.98 cd/A and the CIEx and CIEy color coordinates are 0.157 and 0.085, respectively. The drive voltage of the device is 7.2 volts. The horizontal to perpendicular polarization ratio for the totally integrated emission from 400 nm to 600 nm is 11.7. The polarization ratio obtained at 424 nm is 14.7.

Example 6

An OLED device was prepared as described in Example 3. The nematic oligomeric fluorene used in the light-emitting layer is pentafluorene F(MB)5. The layer thickness is 68 nm. The electroluminescence characteristics obtained at 20 mA/cm are as follows: luminance efficiency is 0.48 cd/A and the CIEx and CIEy color coordinates are 0.159 and 0.091, respectively. The drive voltage of the device is 9.7 volts. The horizontal to perpendicular polarization ratio for the totally integrated emission from 400 nm to 600 nm is 8.6. The polarization ratio obtained at 424 nm is 11.8.

The invention has been described in detail with particular reference to certain preferred embodiments thereof, but it will be understood that variations and modifications can be effected within the spirit and scope of the invention.

PARTS LIST

101 Substrate
103 Anode
105 Conductive alignment layer
107 Hole-injection layer
109 Light-Emitting layer (LEL)
111 Carrier Confinement layer (CCL)
113 Electron-injection layer
115 Cathode
250 Current/Voltage source
260 Electrical conductors

What is claimed is:

1. An OLED device comprising a substrate, an anode electrode and a cathode electrode, a uniaxial alignment layer disposed between the anode electrode and the cathode electrode, a light-emitting layer disposed over the uniaxial alignment layer and capable of producing polarized light, wherein the molecules in the light-emitting layer must be aligned uniaxially along a specific direction and a carrier confinement layer disposed over the light emitting layer and wherein the carrier confinement layer blocks either holes, electrons, or excitons, and wherein recombination of holes from the anode and electrons from the cathode is confined to this layer.

2. An OLED device according to claim 1 wherein the light-emitting layer contains an oligomeric fluorene or a mixture of oligomeric fluorenes.

3. The OLED device according to claim 2 wherein the fluorene or mixture of oligomeric fluorenes includes:

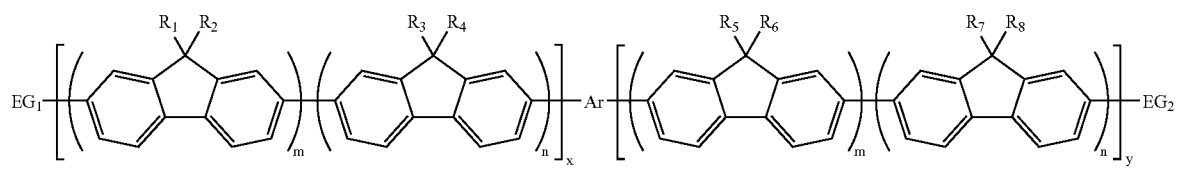

wherein:
$R_1, R_2, R_3, R_4, R_5, R_6, R_7, R_8$ are each individually alkyl of from 1 to 20 carbon atoms, which are branched or unbranched, aryl or substituted aryl of from 5 to 24 carbon atoms, heteroaryl or substituted heteroaryl of from 5 to 24 carbon atoms, alkoxy, aryloxy, alkyl ether or aryl ether;
m+n is in the range of 1 to 20;
x+y is in the range of 1 to 20;
$EG_1$ and $EG_2$ are hydrogen, alkyl of from 1 to 20 carbon atoms, which are branched or unbranched, phenyl or substituted phenyl;
and Ar is:

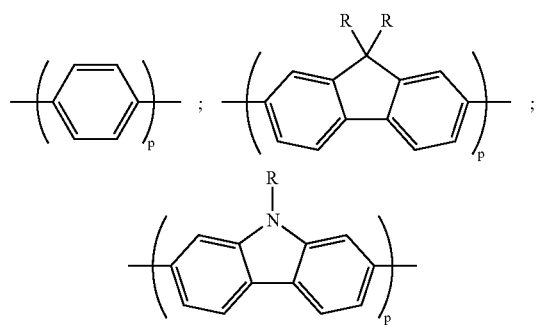

wherein:
p is in a range of from 1 to 10;
R is alkyl of from 1 to 20 carbon atoms, which are branched or unbranched, aryl or substituted aryl of from 5 to 24 carbon atoms, heteroaryl or substituted heteroaryl of from 5 to 24 carbon atoms, alkoxy, aryloxy, alkyl ether or aryl ether,
or,

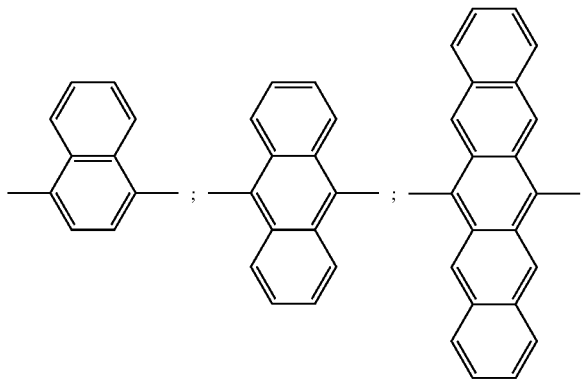

-continued

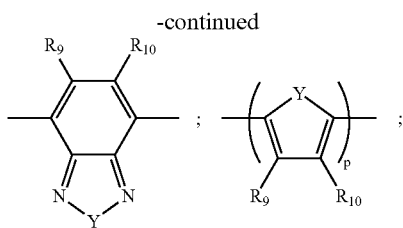

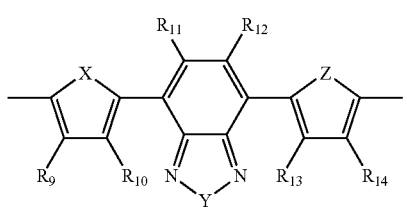

wherein:
p is in the range of from 1 to 10;
$R_9$, $R_{10}$, $R_{11}$, $R_{12}$, $R_{13}$, and $R_{14}$ are each individually hydrogen, alkyl of from 1 to 20 carbon atoms, which are branched or unbranched, aryl or substituted aryl of from 5 to 24 carbon atoms, heteroaryl or substituted heteroaryl of from 5 to 24 carbon atoms, alkoxy, aryloxy, alkyl ether or aryl ether;
and X, Y, and Z are individually oxygen, sulfur, or nitrogen,
or,

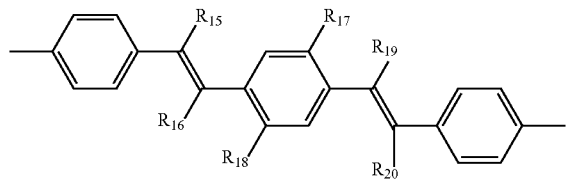

wherein:
R15, R16, R19, and R20 are each individually hydrogen or cyano;
R17, R18, are hydrogen, cyano, alkoxy, alkyl of from 1 to 20 carbon atoms, aryl or substituted aryl of from 5 to 24 carbon atoms.

4. An OLED device according to claim 1 wherein the electroluminescence generated from the device is polarized light with a dichroic ratio greater than 10.

5. An OLED device according to claim 1 wherein the uniaxial alignment layer is disposed on the light-emitting layer.

6. An OLED device according to claim 1 wherein the light emitting layer is disposed between the uniaxial alignment layer and the carrier confinement layer.

7. An OLED device according to claim 1 wherein the uniaxial alignment layer is a rubbed polymer thin film.

8. An OLED device according to claim 1 wherein the uniaxial alignment layer is a vapor-deposited thin film.

9. An OLED device according to claim 1 wherein the uniaxial alignment layer is a photo-crosslinked polymer.

10. An OLED device according to claim 1 wherein the carrier confinement layer transports electrons and blocks holes.

11. An OLED device according to claim 1 wherein the carrier confinement layer transports holes and blocks electrons.

12. An OLED device according to claim 1 wherein the carrier confinement layer blocks excitons generated in the light-emitting layer.

13. An OLED device according to claim 1 wherein the ionization potential of the carrier confinement layer is greater than that of the light-emitting layer.

14. An OLED device according to claim 1 wherein the ionization potential of the carrier confinement layer is greater than 5.5 eV.

15. An OLED device according to claim 1 wherein the carrier confinement layer is comprised of organic compounds each with an ionization potential greater than 5.5 eV.

16. An OLED device according to claim 1 wherein the light-emitting layer contains a compound of the formula:

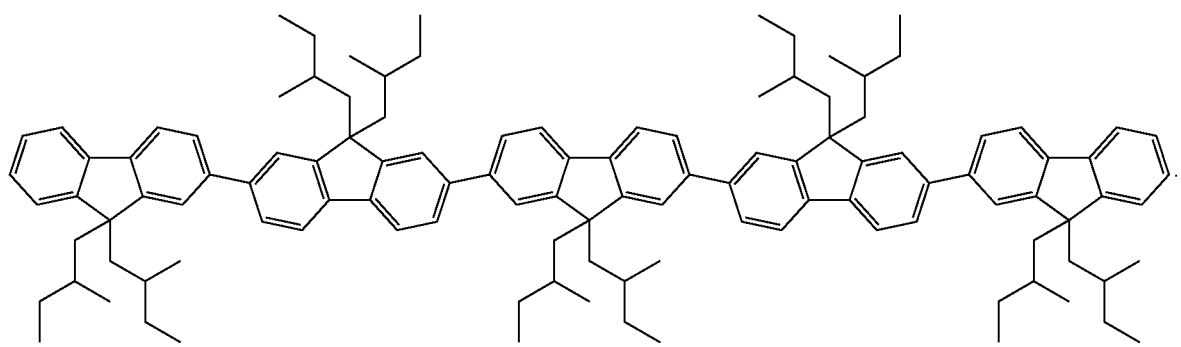

17. An OLED device according to claim 1 wherein the light-emitting layer contains a compound of the formula:
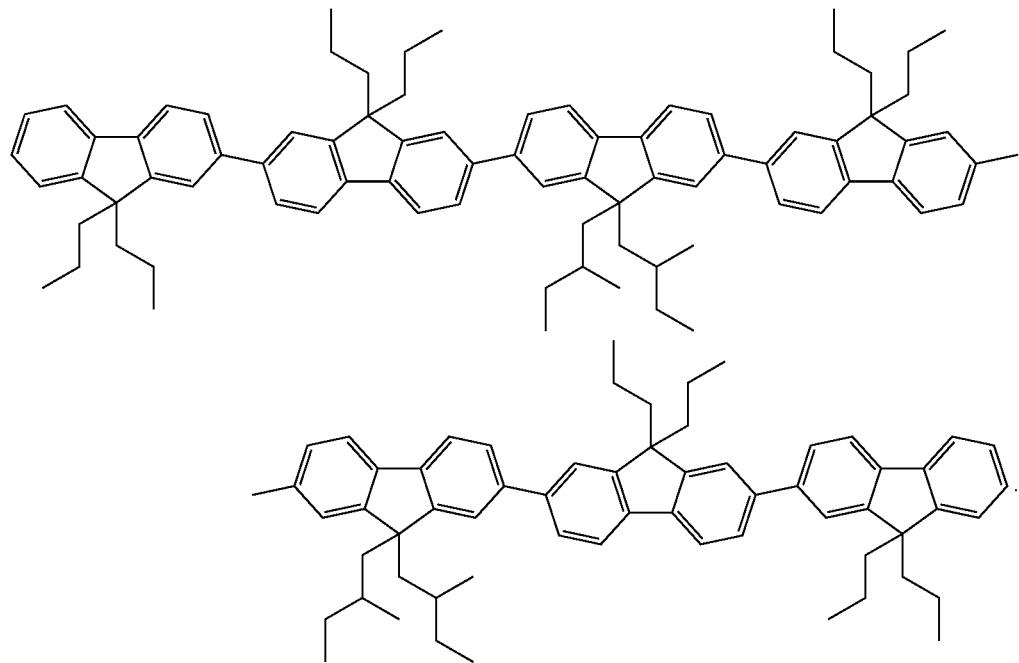
18. An OLED device according to claim 1 wherein the light-emitting layer contains a compound of the formula:
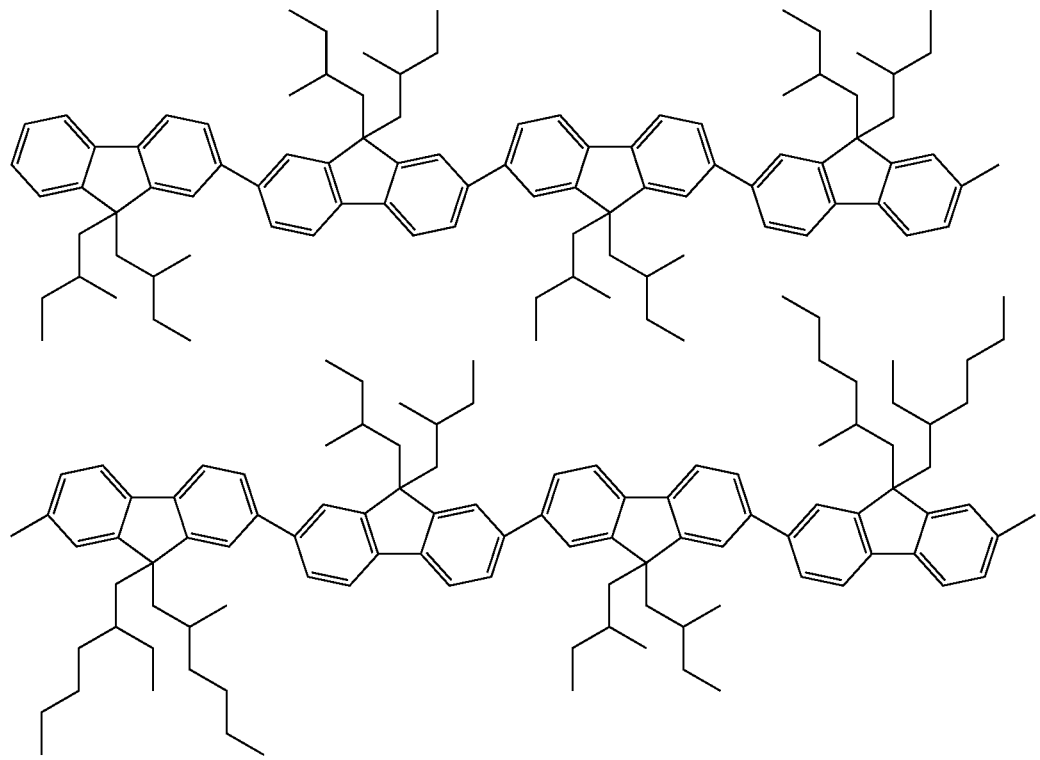

-continued
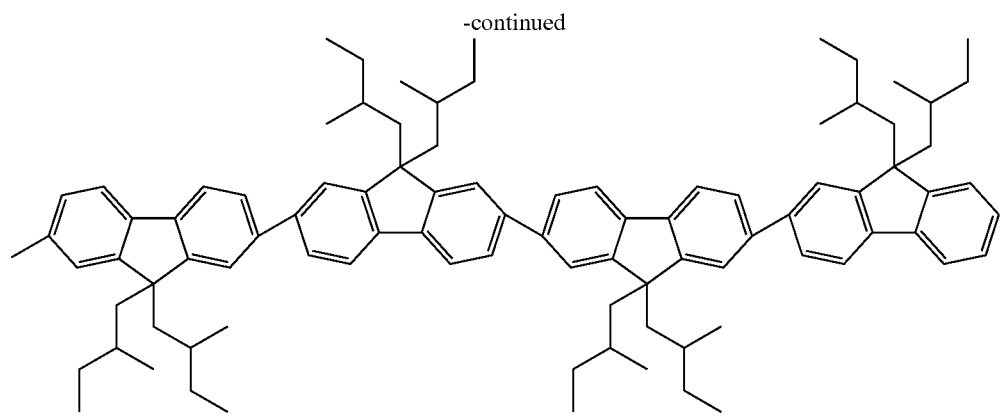
19. An OLED device according to claim 1 wherein the light emitting layer contains a compound of the formula:
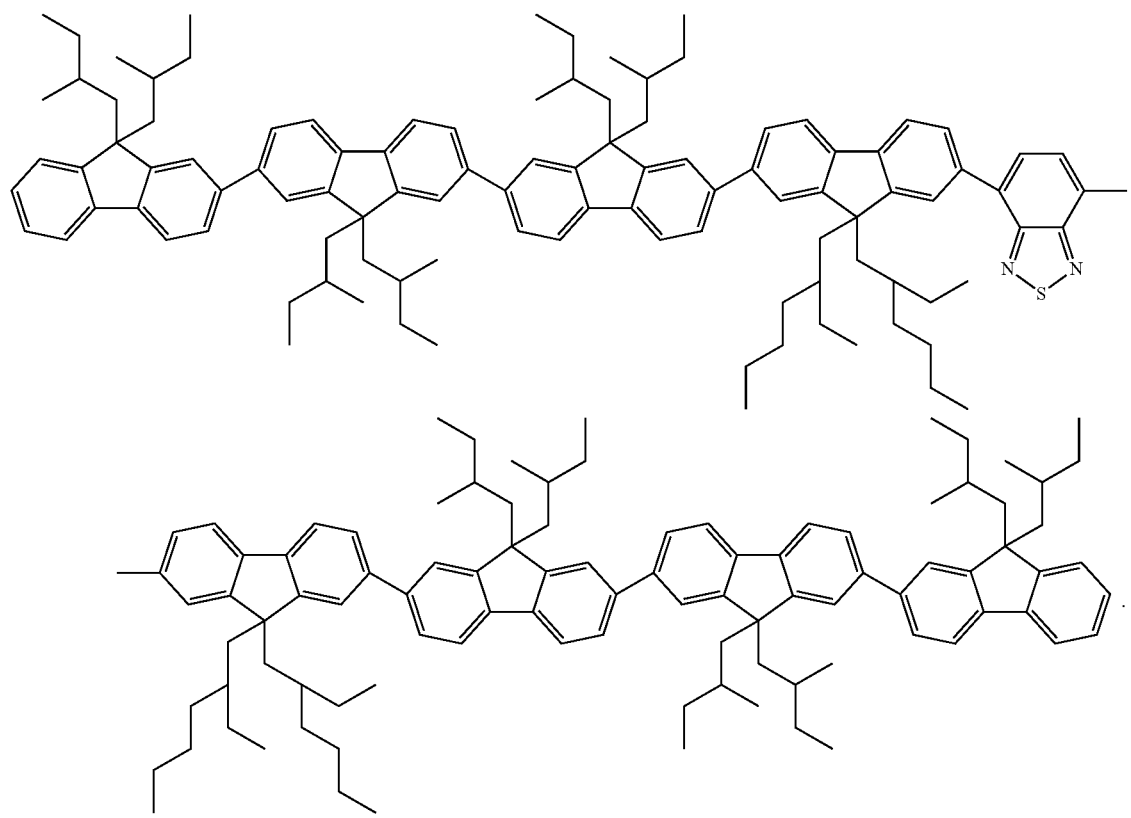
* * * * *

UNITED STATES PATENT AND TRADEMARK OFFICE
CERTIFICATE OF CORRECTION

PATENT NO. : 7,037,599 B2  Page 1 of 1
APPLICATION NO. : 10/377046
DATED : May 2, 2006
INVENTOR(S) : Sean W. Culligan et al.

It is certified that error appears in the above-identified patent and that said Letters Patent is hereby corrected as shown below:

On Title Page, Item (73) col. 1
Assignees should read:

Eastman Kodak Company, Rochester, New York (US) and University of Rochester, Rochester, New York (US)

Signed and Sealed this

Fifth Day of September, 2006

JON W. DUDAS
*Director of the United States Patent and Trademark Office*

UNITED STATES PATENT AND TRADEMARK OFFICE
CERTIFICATE OF CORRECTION

PATENT NO. : 7,037,599 B2 Page 1 of 1
APPLICATION NO. : 10/377046
DATED : May 2, 2006
INVENTOR(S) : Sean W. Culligan et al.

It is certified that error appears in the above-identified patent and that said Letters Patent is hereby corrected as shown below:

On Title Page, Item (73) col. 1
Assignees should read:

Eastman Kodak Company, Rochester, New York (US) and University of Rochester, Rochester, New York 14627 (US)

This certificate supersedes the Certificate of Correction issued September 5, 2006.

Signed and Sealed this

Nineteenth Day of August, 2008

JON W. DUDAS
*Director of the United States Patent and Trademark Office*